United States Patent
Nagaoka et al.

(10) Patent No.: US 12,237,141 B2
(45) Date of Patent: Feb. 25, 2025

(54) LAMINATE, ELECTRON SOURCE AND ELECTRONIC DEVICE CONTAINING LAMINATE, AND PRODUCTION METHOD AND CLEANING METHOD FOR LAMINATE

(71) Applicant: NATIONAL INSTITUTE FOR MATERIALS SCIENCE, Ibaraki (JP)

(72) Inventors: Katsumi Nagaoka, Tsukuba (JP); Takashi Aizawa, Tsukuba (JP); Shun-Ichiro Ohmi, Tokyo (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 18/694,081

(22) PCT Filed: Sep. 20, 2022

(86) PCT No.: PCT/JP2022/034976
§ 371 (c)(1),
(2) Date: Mar. 21, 2024

(87) PCT Pub. No.: WO2023/048139
PCT Pub. Date: Mar. 30, 2023

(65) Prior Publication Data
US 2024/0395494 A1   Nov. 28, 2024

(30) Foreign Application Priority Data

Sep. 22, 2021 (JP) ................................. 2021-154427

(51) Int. Cl.
*H01J 37/075* (2006.01)
*H01J 9/04* (2006.01)
*H01J 37/26* (2006.01)

(52) U.S. Cl.
CPC ............. *H01J 37/075* (2013.01); *H01J 9/04* (2013.01); *H01J 37/26* (2013.01); *H01J 2237/06308* (2013.01)

(58) Field of Classification Search
CPC .. H01J 37/075; H01J 9/04; H01J 37/26; H01J 2237/06308
See application file for complete search history.

(56) References Cited

U.S. PATENT DOCUMENTS 10,978,290 B1 * 4/2021 Coe-Sullivan .......... H01J 1/308
2015/0084013 A1 3/2015 Ohmi

FOREIGN PATENT DOCUMENTS

| JP | 2011-208189 A | 10/2011 |
| JP | 5665112 B2 | 2/2015 |
| WO | 2015/044980 A1 | 4/2015 |

OTHER PUBLICATIONS

Nishitani et al., "Surface Structures and Work Functions of the LaB6 (100), (110) and (111) Clean Surfaces," Surface Science, 93: 535-549 (1980).
Nishitani et al., "Oxygen Adsorption on the LaB6 (100), and (111) Surfaces," Surface Science, 115: 48-60 (1982).
Rokuta et al., "Phonon Dispersion of an Epitaxial Monolayer Film of Hexagonal Boron Nitride on Ni(111)," Physical Review Letters, 79 (23): 4609-4612 (1997).
International Search Report issued in corresponding International Patent Application No. PCT/JP2022/034976 dated Nov. 15, 2022.

* cited by examiner

*Primary Examiner* — Donald L Raleigh
(74) *Attorney, Agent, or Firm* — Morgan, Lewis & Bockius LLP

(57) ABSTRACT

The purpose of the present invention, relating to lanthanide boride, which is known as a low work function material, is to provide a novel low work function material with low chemical reactivity, in particular a low work function material of which the material surface, after being exposed to atmospheric gases, can be cleaned at a heating temperature lower than in the prior art. The present invention is a laminate containing a lanthanide boride film formed on a substrate, the surface of said film being covered by a thin film, wherein the thin film is a monatomic layer of a hexagonal boron nitride thin film.

12 Claims, 7 Drawing Sheets

FIG. 1

LIST OF WORK FUNCTIONS OF TYPICAL RARE EARTH AND ALKALINE EARTH METAL HEXABORIDES

| MEASURE-MENT METHOD | | $LaB_6$ | $CeB_6$ | $PrB_6$ | $NdB_6$ | $GdB_6$ | $CaB_6$ | $SrB_6$ | $BaB_6$ [eV] |
|---|---|---|---|---|---|---|---|---|---|
| | PHOTOELECTRON EMISSION | 2.3[a] | 2.6[b] | — | — | 3.8[b] | — | — | — |
| | THERMAL ELECTRON EMISSION | 2.66[c] | 2.59[c] | 2.73[c] | 3.04[d] | 2.62[d] | 2.86[c] | 2.67[c] | 3.45[c] |

[a] Nishitani et al., Surf. Sci. 93, 535 (1980).
[b] Tanaka et al., J. Appl. Phys. 51, 3877 (1980).
[c] Lafferty, J. Appl. Phys. 22, 299 (1951).
[d] Liu et al., Appl. Surf. Sci. 434, 613 (2018).
[e] Liu et al., Vacuum 151, 76 (2018).

AUGER ELECTRON SPECTROSCOPY (AES)

X-RAY ABSORPTION NEAR EDGE STRUCTURE (XANES) SPECTRA

LAMINATE, ELECTRON SOURCE AND ELECTRONIC DEVICE CONTAINING LAMINATE, AND PRODUCTION METHOD AND CLEANING METHOD FOR LAMINATE

TECHNICAL FIELD

The present invention relates to a laminate containing a lanthanoid boride film formed on a substrate wherein a surface of the lanthanoid boride film is coated with a thin film, and wherein the thin film is a monoatomic layer hexagonal boron nitride thin film. That is, the present invention relates to a laminate having a substrate and a lanthanoid boride film formed on the substrate, wherein the laminate has a structure of coating a surface of the lanthanoid boride film with a monoatomic layer hexagonal boron nitride thin film.

The present invention also relates to an electron source and an electronic device that includes the above laminate.

The present invention also relates to a method for producing the above laminate.

The present invention also relates to a method for cleaning the above laminate.

BACKGROUND ART

Low work function materials have a high electron emission efficiency, and therefore are promising as electronic materials for electron sources, electronic devices, and the like. For example, a lanthanum hexaboride ($LaB_6$) film that is a lanthanoid boride has a low work function of 2.3 eV on the (100) plane and exhibits a high electron emission efficiency, and therefore, it has been reported that the lanthanum hexaboride ($LaB_6$) film is used as an electron source material (NON PATENT LITERATURE 1).

Also, since lanthanum hexaboride that is a lanthanoid boride is a low work function material as described above, studies on surface structures and work functions of clean (100), (110), and (111) surfaces thereof have been also conducted (NON PATENT LITERATURE 2).

Also, regarding a method for producing a lanthanum hexaboride ($LaB_6$) film that is a lanthanoid boride, a method for forming a $LaB_6$ film with sputtering process has been reported (PATENT LITERATURE 1). Specifically, PATENT LITERATURE 1 discloses that when a $LaB_6$ film is formed by means of sputtering deposition, a $LaB_6$ target is sputtered in an argon ambient to which 0.01 to 5 vol % of nitrogen gas is added, and annealing is performed in an inert ambient, whereby a $LaB_6$ film having excellent crystallinity is obtained.

In addition, as shown in FIG. 1, it is known that various lanthanoid borides and alkaline earth metal borides have a low work function and can be a high-efficiency electron emission source.

CITATION LIST

Patent Literature

PATENT LITERATURE 1: JP 5665112 B

Non Patent Literature

NON PATENT LITERATURE 1: R. Nishitani, et al., "SURFACE STRUCTURES AND WORK FUNCTIONS OF THE $LaB_6$(100), (110) and (111) CLEAN SURFACES", Surf. Sci, 93, 535-549 (1980)

NON PATENT LITERATURE 2: R. Nishitani, et al., "OXYGEN ADSORPTION ON THE $LaB_6$(100), (110) AND (111) SURFACES", Surf. Sci, 115, 48-60 (1982)

SUMMARY OF INVENTION

Technical Problem

However, when the low work function material described above is actually used as an electronic material such as an electron source or an electronic device, there are the following problems.

Low work function materials generally have high chemical reactivity because they have a property of easily emitting electrons. Therefore, an ambient gas is easily adsorbed to the material surface, and the surface is easily contaminated. That is, a compound is easily formed on the surface of the low work function material. As a result, the work function easily increases, and increase in the work function causes instability and attenuation of emission current.

Therefore, in order to recover the low work function state from the high work function state caused by the contaminated surface state (that is, the surface state in which the compound is formed), it is necessary to re-clean the surface by vacuum heating. However, in the case of a low work function material, since the compound formed on the surface is stable, vacuum heating needs to be performed at a high temperature of 1300° C. or higher in order to re-clean the surface.

In fact, NON PATENT LITERATURE 2 reports that, in lanthanum hexaboride ($LaB_6$) known as a low work function material, when surface atoms are oxidized by being bonded to oxygen in an ambient gas such as air exposure and residual gas adsorption, the work function rapidly increases, and in order to recover a low work function state from this high work function state, the surface is cleaned by heating at a high temperature of 1300° C. or higher in vacuum.

For these reasons, lanthanoid boride that is known as a low work function material such as lanthanum hexaboride has high chemical reactivity, and when the lanthanoid boride is used as an electronic material such as an electron source or an electronic device, a compound is easily formed on the surface of the lanthanoid boride in an ambient gas such as air exposure or residual gas adsorption, and the surface state becomes a high work function state. Therefore, in order to recover the low work function state from the high work function state, it is generally understood as it is necessary to clean the surface by performing vacuum heating at an extremely high temperature of 1300° C. or higher.

However, when vacuum heating at an extremely high temperature of 1300° C. or higher as described above is used as an electronic material such as an electron source or an electronic device which is easily affected by a temperature, deterioration of a material which is not desirable as the electronic material is caused, which causes a short life.

In view of such circumstances, as to lanthanoid boride that is known as a low work function material, when the lanthanoid boride is used as an electronic material such as an electron source or an electronic device, development of a novel low work function material having low chemical reactivity, in particular, development of a low work function material wherein a surface of the low work function material after being exposed to an ambient gas can be cleaned by vacuum heating at a temperature lower than that in the prior art is desired.

Therefore, the present invention relates to lanthanoid boride that is known as a low work function material, and an object thereof is to provide a novel low work function material with low chemical reactivity, in particular a low work function material wherein a surface of the low work function material after being exposed to an ambient gas can be cleaned by vacuum heating at a temperature lower than in the prior art. Specifically, an object of the present invention is to provide a laminate containing a lanthanoid boride film formed on a substrate wherein a surface of the lanthanoid boride film is coated with a thin film, and wherein the thin film is a monoatomic layer hexagonal boron nitride thin film.

Alternatively, an object of the present invention is to provide a laminate wherein the laminate exposed to an ambient gas can be cleaned by vacuum heating at a lower temperature than in the prior art (specifically, lower than 1300° C.).

Alternatively, an object of the present invention is to provide a laminate wherein a work function after cleaning the laminate exposed to an ambient gas by vacuum heating at a temperature lower than in the prior art (specifically, lower than 1300° C.) is approximately the same as a work function before being exposed to the ambient gas, and the low work function of the laminate is maintained and stored without being increased even after the cleaning.

Alternatively, the present invention relates to lanthanoid boride that is known as a low work function material, and an object thereof is to provide an electron source and an electronic device that use a novel low work function material with low chemical reactivity, in particular a low work function material wherein a surface of the low work function material after being exposed to an ambient gas can be cleaned by vacuum heating at a temperature lower than in the prior art (specifically, lower than 1300° C.). Specifically, an object of the present invention is to provide an electron source and an electronic device that include the above laminate.

Alternatively, the present invention relates to lanthanoid boride that is known as a low work function material, and an object thereof is to provide an electron source and an electronic device that use a novel low work function material with low chemical reactivity, in particular a method for producing a low work function material wherein a surface of the low work function material after being exposed to ambient gases can be cleaned by vacuum heating at a temperature lower than in the prior art (specifically, lower than 1300° C.). Specifically, an object of the present invention is to provide a method for producing the above laminate.

Alternatively, the present invention relates to lanthanoid boride that is known as a low work function material, and an object thereof is to provide a method for cleaning a material surface by vacuum heating at a temperature lower than in the prior art (specifically, lower than 1300° C.) after being exposed to an ambient gas. Specifically, an object of the present invention is to provide a method for cleaning the above laminate.

Solution to Problem

As a result of intensive studies, as to lanthanoid boride that is known as a low work function material, the present inventors have firstly found that the above described problems can be solved by coating a lanthanoid boride film formed on a substrate with a so-called chemically stable protective film that has a low gas adsorption probability to an ambient gas as well as that can maintain the low work function of the lanthanoid boride without increasing the work function (specifically, a monoatomic layer insulator thin film having a low gas adsorption probability and an extremely thin film thickness), and have completed the present invention.

The present invention specifically has aspects [1] to as described below.

[1]

A laminate comprising a lanthanoid boride film formed on a substrate, wherein a surface of the lanthanoid boride film is coated with a thin film, and wherein the thin film is a monoatomic layer hexagonal boron nitride thin film.

[2]

The laminate according to [1], wherein the lanthanoid boride film is a lanthanum hexaboride film.

[3]

The laminate according to [1] or [2], wherein the lanthanoid boride film has a thickness of 1 nm or more and 100 nm or less.

[4]

The laminate according to any one of [1] to [3], wherein a work function of the laminate after being exposed to an ambient gas and then performing vacuum heating at 500° C. or higher and 600° C. or less is approximately the same as a work function of the laminate before being exposed to the ambient gas.

[5]

An electron source comprising the laminate according to any one of [1] to [4].

[6] An electronic device comprising the laminate according to any one of [1] to [4].

[7]

A method for producing the laminate according to any one of [1] to [4], the method comprising:

forming a lanthanoid boride film containing nitrogen on a substrate; and diffusing the nitrogen in the lanthanoid boride film by heating the lanthanoid boride film in a temperature range of higher than 750° C. and lower than 1200° C. in vacuum, reacting the nitrogen with boron atoms contained in the lanthanoid boride film on a surface of the lanthanoid boride film to precipitate a monoatomic layer hexagonal boron nitride thin film on the surface of the lanthanoid boride film, and coating the surface of the lanthanoid boride film with the precipitated monoatomic layer hexagonal boron nitride thin film.

[8]

The method according to [7], wherein the lanthanoid boride film containing the nitrogen is formed by: using a lanthanoid boride sintered body containing nitrogen as a target; and sputtering the target in an inert gas ambient.

[9]

The method according to [7], wherein the substrate is a lanthanoid boride single crystal substrate or a $SiO_2$ substrate including a polycrystalline lanthanoid boride film, and the lanthanoid boride film is formed by irradiating the surface of the substrate with nitrogen radicals.

[10]

The method according to any one of [7] to [9], wherein coating the surface of the lanthanoid boride film with the precipitated monoatomic layer hexagonal boron nitride thin film is performed by heating in vacuum in the range of $1\times10^{-9}$ Pa or higher and $1\times10^{-5}$ Pa or less for 5 minutes or more and 3 hours or less to diffuse the nitrogen.

[11]

A method for cleaning a laminate, comprising:

exposing the laminate in which a surface of a lanthanoid boride film formed on a substrate is coated with a thin film made of monoatomic layer hexagonal boron nitride to an ambient gas, and then subjecting the laminate contaminated with the ambient gas to vacuum heating at a low temperature of 500° C. or higher and 600° C. or less to clean the laminate.

[12]

The method for cleaning the laminate according to [11], wherein the lanthanoid boride film is a lanthanum hexaboride film.

Advantageous Effects of Invention

According to the present invention, a laminate can be provided in which a surface of a lanthanoid boride film formed on a substrate is coated with a thin film as a novel low work function material having low chemical reactivity, wherein the thin film is a chemically stable protective film that can be maintained without increasing the work function of the lanthanoid boride film having the low work function (for example, a lanthanum hexaboride ($LaB_6$) film) (specifically, a monoatomic layer hexagonal boron nitride thin film).

Alternatively, according to the present invention, by the use of the above laminate, the laminate exposed to the ambient gas can be cleaned by vacuum heating at a lower temperature than in the prior art (specifically, lower than 1300° C.).

Alternatively, according to the present invention, by the use of the above laminate, even if the laminate exposed to the ambient gas is cleaned by vacuum heating at a lower temperature than in the prior art (specifically, lower than 1300° C.), a work function after the heating is approximately the same as a work function before being exposed to the ambient gas, and thus the low work function of the laminate can be maintained and stored without being increased even after cleaning.

Alternatively, according to the present invention, an electron source and an electronic device that include the above laminate can be obtained. As described above, the above laminate after being exposed to the ambient gas can be cleaned by vacuum heating at a lower temperature than in the prior art (specifically, lower than 1300° C.), and thus, according to the present invention, an electron source and an electronic device that are less thermal damage can be provided.

Also, as described above, even if the above laminate is cleaned by vacuum heating at a temperature lower than that in the prior art (specifically, lower than 1300° C.) after being exposed to the ambient gas, a work function after the heating is approximately the same as a work function before being exposed to the ambient gas, and the low work function of the laminate can be maintained and stored without being increased even after cleaning. Therefore, according to the present invention, a stable emission current can be obtained as an electron source or an electronic device.

For this reason, according to the present invention, a long life of an electron source and an electronic device can be expected.

Alternatively, according to the present invention, a novel cleaning method for cleaning a low work function material exposed to an ambient gas by vacuum heating at a lower temperature than in the prior art (specifically, lower than 1300° C.) can be provided.

According to the present invention, a novel low work function material having low chemical reactivity can be provided, and thus residual gas adsorption that is a factor of instability of emission current can be suppressed due to a characteristic of a low gas adsorption probability. Therefore, the stability of emission current can be improved. Accordingly, for example, high performance of electron microscope can be expected by the use of an electron source including the laminate described above. In particular, since such an electron source has a low gas adsorption probability; the electron microscope can be also usually operated in a low-vacuum environment in which the surface is rapidly contaminated, and as a result, the high resolution of an electron microscope image regarding a material that needs to be observed in a low-vacuum environment such as a biological sample can be expected.

BRIEF DESCRIPTION OF DRAWINGS

FIG. 1 is a diagram of a list of work functions of typical rare earth and alkaline earth metal hexaborides.

DESCRIPTION OF EMBODIMENTS

Figure 2:
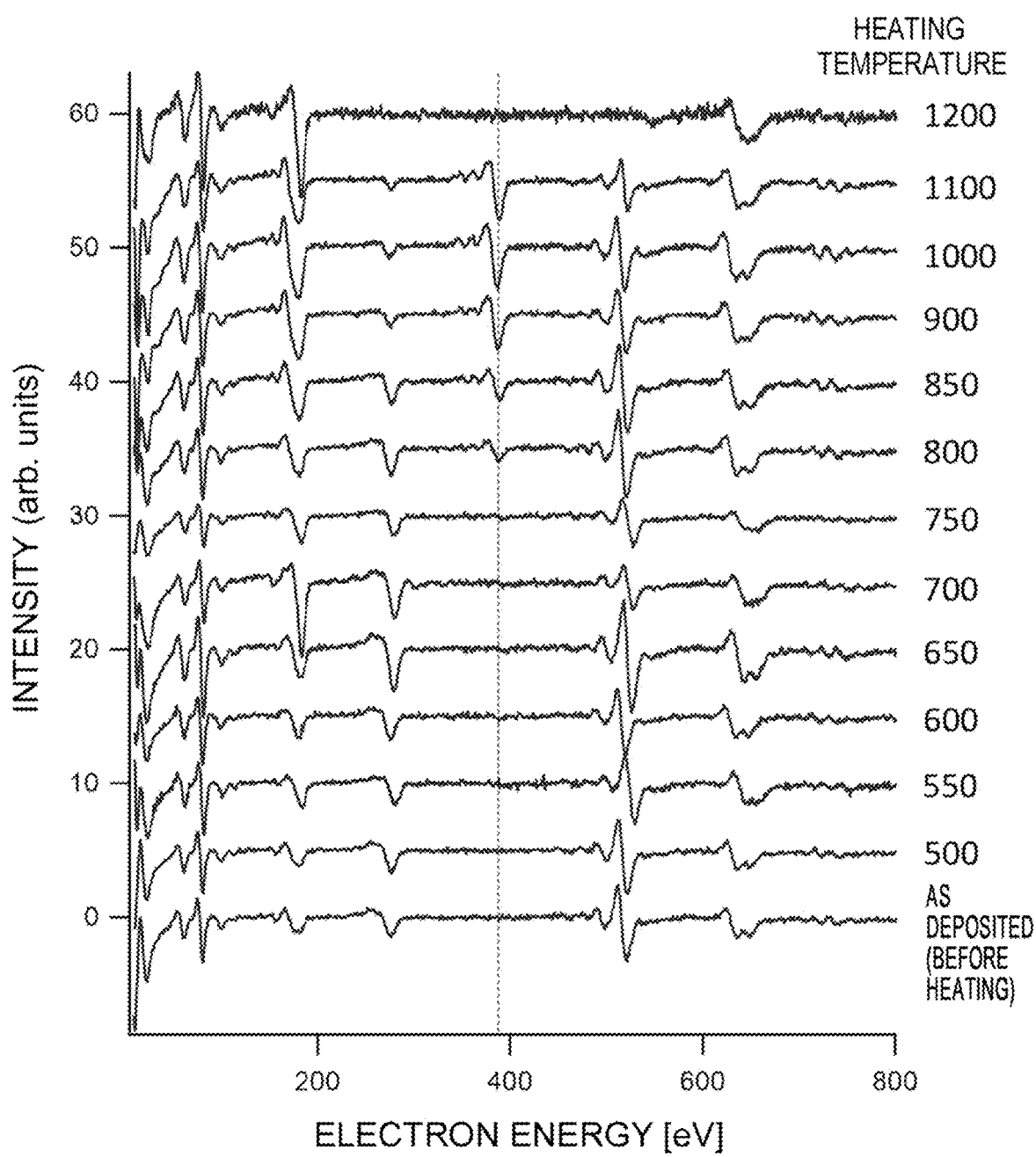
FIG. 2 is Auger electron spectroscopy (AES) measurement results, and is a diagram showing results related to changes in surface composition depending on heating temperatures of a lanthanum hexaboride ($LaB_6$) film containing nitrogen formed on a substrate by means of sputtering deposition.

Hereinafter, embodiments for performing the present invention will be described in detail. It should be noted that the present invention is not limited to the following embodiments, and various modifications can be made within the scope of the gist of the present invention.

One aspect of the present invention is a laminate containing a lanthanoid boride film formed on a substrate wherein a surface of the film is coated with a thin film, and wherein the thin film is a monoatomic layer hexagonal boron nitride thin film. That is, the laminate of the present invention has a substrate and a lanthanoid boride film formed on the substrate, and has a structure of coating a surface of the lanthanoid boride film with a monoatomic layer hexagonal boron nitride thin film.

The substrate for forming the above lanthanoid boride film is not particularly limited as long as the object of the present invention can be achieved, but it is preferable to use a lanthanoid boride single crystal substrate or a $SiO_2$ substrate including a polycrystalline lanthanoid boride film (which is a so-called $SiO_2$ substrate with polycrystalline lanthanoid boride film).

In addition, the lanthanoid boride single crystal substrate or the polycrystalline lanthanoid boride film included in the $SiO_2$ substrate more preferably has the same material as the lanthanoid boride film formed on the substrate. This means that, for example, in a case where the lanthanoid boride film formed on the substrate is a lanthanum hexaboride ($LaB_6$) film, it is more preferable to use, as the substrate, a lanthanum hexaboride single crystal substrate or a $SiO_2$ substrate including a polycrystalline lanthanum hexaboride film.

Here, the phrase "including a polycrystalline lanthanum hexaboride film" means that the polycrystalline lanthanum hexaboride ($LaB_6$) film has only to exist in a form, such as a form laminated on a $SiO_2$ substrate. And, the method for forming the polycrystalline lanthanum hexaboride film is not particularly limited as long as the object of the present invention can be achieved, and examples thereof include vapor deposition and precipitation on a $SiO_2$ substrate, and the like.

Regarding the polycrystalline lanthanoid boride film included in the $SiO_2$ substrate, the film thickness of the polycrystalline lanthanum hexaboride film is not particularly limited as long as the object of the present invention can be achieved, but it is preferably 20 to 60 nm.

In the present invention, the lanthanoid boride is used as a substrate material or a material of a lanthanoid boride film formed on a substrate.

The lanthanoid boride used in the present invention is not particularly limited as long as it is a compound having a low work function and containing a lanthanoid atom and a boron atom, and examples thereof include lanthanoid borides such as $LaB_6$, $CeB_6$, $PrB_6$, $NdB_6$, and $GdB_6$. From the viewpoint of versatility and electron emission efficiency, $LaB_6$ (work function: 2.3 eV) and $CeB_6$ (work function: 2.6 eV) having a low work function are preferable, and $LaB_6$ is more preferable.

Here, the lanthanoid atom is an atom corresponding to atomic numbers 57 to 71 of the periodic table, that is, 15 atoms from lanthanum to lutetium in the periodic table.

The low work function in the present application may be energy (unit: eV) that is generally understood as having a low work function, but is specifically preferably 4 eV or less. The work function is more preferably 3.5 eV or less, and still more preferably 3 eV or less. From the viewpoint of high electron emission efficiency, a lower work function is more preferable.

Regarding the lanthanoid boride film in the present invention, nitrogen may or may not be contained as long as the object of the present invention can be achieved. However, it is preferable to contain nitrogen from the viewpoint that self-repair can be performed by reheating when the surface of the laminate of the present invention is deteriorated.

When the above lanthanoid boride film contains nitrogen, the content (wt %) is preferably 0.1 wt % or higher and 2 wt % or less, and higher preferably 0.2 wt % or higher and 0.5 wt % or less.

The film thickness of the lanthanoid boride film formed on the substrate is not particularly limited as long as the object of the present invention can be achieved. However, from the viewpoint of electron emission efficiency, the above film thickness is preferably in the range of 1 nm or more and 100 nm or less, more preferably in the range of 5 nm or more and 100 nm or less, and still more preferably in the range of 20 nm or more and 60 nm or less.

In the present invention, the thin film coating the lanthanoid boride film formed on the substrate is a monoatomic layer hexagonal boron nitride thin film.

The "hexagonal boron nitride" as a material of the above thin film is a layered material and is an inert material having no dangling bond (that is, an insulating material). Therefore, the "hexagonal boron nitride" has a property of suppressing a bonding with an ambient gas and preventing formation of an undesirable compound such as an oxide. That is, the hexagonal boron nitride is a chemically stable material having a low gas adsorption probability to an ambient gas, and is an effective material as a protective film coating the lanthanoid boride film formed on the substrate.

In addition, the "thin film" of the above hexagonal boron nitride thin film means that the thickness of hexagonal boron nitride as an insulating material is extremely thin so as to cause physical adsorption without charge transfer when adsorbed to a lanthanoid boride film coated as a base. Specifically, the thin film is two atomic layers or less, and is preferably a monoatomic layer. In the case of the physical adsorption, since the thin film and the base are bonded so that vacuum levels are aligned, the low work function of the lanthanoid boride film coated as the base is maintained and stored as the work function of the system. That is, the low work function of the lanthanoid boride film is maintained and stored even in the state of being coated with the above hexagonal boron nitride thin film. As such, in the present application, in consider of the fact that the work function of the laminate of the present invention (that is, the work function of the system) means the work function of a surface of the laminate, the work function of the lanthanoid boride film constituting the above laminate is the work function of the laminate of the present invention (that is, the work function of the system).

As described above, since the above hexagonal boron nitride thin film has a thickness as the "thin film" that is extremely thin so as to cause the above physical adsorption (specifically, the thin film is two atomic layers or less, and is preferably a monoatomic layer), the hexagonal boron nitride thin film becomes a protective film effective for maintaining and storing the low work function of the lanthanoid boride film coated as the base.

Therefore, the "monoatomic layer hexagonal boron nitride thin film" used in the present invention is a chemically stable protective film (specifically, a protective film having a low gas adsorption probability to an ambient gas) for coating a lanthanoid boride film having a low work function formed on a substrate, and is also a protective film for maintaining and storing the low work function without increasing the work function of the lanthanoid boride film.

Incidentally, a so-called graphene that is monoatomic layer graphite cannot be used as an alternative to the "monoatomic layer hexagonal boron nitride thin film" used in the present invention. This is because, since graphene is a conductive material, adsorption of the graphene to the lanthanoid boride film coated as the base is accompanied by charge transfer, and as a result, the low work function of the lanthanoid boride film coated as the base cannot be maintained and stored as the work function of the system. That is, this is because, in a case where the thin film coating the lanthanoid boride film formed on the substrate is graphene, the work function of the above lanthanoid boride film in the state of being coated with graphene increases so as to be beyond the low work function that a lanthanoid boride film inherently has, and thus the low work function that a lanthanoid boride film inherently has cannot be maintained and stored.

The "hexagonal boron nitride thin film" used in the present invention is more preferably a monoatomic layer having good crystallinity. Therefore, the "hexagonal boron nitride thin film" used in the present invention is desirably self-formed on the surface of the low work function material to be coated as a base, and also from this viewpoint, the low work function material to be coated as the base is preferably a lanthanoid boride film.

As described above, the material of the lanthanoid boride film is not particularly limited as long as it is a compound having a low work function and containing a lanthanoid atom and a boron atom, and examples thereof include lanthanoid borides such as $LaB_6$, $CeB_6$, $PrB_6$, $NdB_6$, and $GdB_6$. Among the lanthanoid boride films made of these lanthanoid borides as a material, also from the viewpoint of self-formation of a "hexagonal boron nitride thin film", a lanthanum hexaboride ($LaB_6$) film and a cerium hexaboride ($CeB_6$) film are preferable, and a lanthanum hexaboride ($LaB_6$) film is more preferable.

As described above, the laminate of the present invention has a substrate and a lanthanoid boride film formed on the substrate, and has a structure of coating a surface of the lanthanoid boride film with a monoatomic layer hexagonal boron nitride thin film, and the surface of the above laminate can be cleaned even by vacuum heating at a temperature lower than 1300° C. (for example, a temperature range of 500° C. or higher and 600° C. or less) after being exposed to an ambient gas.

Also, the work function of the laminate before and after the above cleaning is approximately the same, and the low work function of the laminate is maintained and stored without increase even if the laminate is cleaned after being exposed to the ambient gas.

As described above, the fact that cleaning by vacuum heating can be performed at a heating temperature lower than that in the prior art even though the work function of the laminate of the present invention given by vacuum heating for cleaning the surface thereof after the laminate of the present invention is exposed to the ambient gas is approximately the same as the work function of the laminate of the present invention before the laminate of the present invention is exposed to the above ambient gas means that the gas adsorption probability of the laminate of the present invention is low:

Here, the phrase "approximately the same" means that the work function of the laminate after cleaning is within a range of +0.5 eV or less from the work function thereof before cleaning. Incidentally, the fact that the work function of the laminate after cleaning becomes smaller than the work function thereof before cleaning is not particularly problematic because it is in line with the object of the present invention to provide a laminate that maintains and stores the low work function of the laminate without increase even after cleaning as described above.

The heating temperature after being exposed to the ambient gas may be lower than 1300° C., but is preferably 600° C. or less, in view of the object of the present invention that heating is performed at a heating temperature lower than that in the prior art (specifically, a temperature lower than 1300° C.). The temperature is preferably lower, but when the heating temperature is too low; the laminate cannot be sufficiently cleaned, and it is difficult to maintain the low work function of the laminate, so that the temperature desirably exceeds 450° C. from the viewpoint of performing sufficient cleaning. The heating temperature is preferably 500° C. or higher, and more preferably 550° C. or higher.

The ambient during heating after being exposed to the ambient gas is preferably in vacuum. However, as long as the object of the present invention can be achieved, it may be in an inert ambient and is not limited to vacuum.

In the case of vacuum heating in which heating is performed in vacuum, the vacuum pressure is preferably in the range of $1 \times 10^{-5}$ Pa or less, and more preferably in the range of $5 \times 10^{-7}$ Pa or less.

Hereinafter, regarding the present invention, one aspect different from the above laminate as one aspect of the present invention will be described, but the description already described in the laminate as one aspect of the present invention is similarly applied unless otherwise specified.

Another aspect of the present invention is an electron source or an electronic device including the above laminate.

The electron source is an electron emission source, and examples of the electron emission method include thermal electron emission, photoelectron emission, field emission, and secondary electron emission due to electron or ion impact, depending on the type of energy to be applied. The electron source is used for a scanning electron microscope (SEM), a transmission electron microscope (TEM), an electron probe microanalyzer (EPMA) surface analyzer, a metal 3D printer, a microfocus X-ray source, a lithography apparatus, and the like.

The electronic device may be any device generally understood as an electronic device, and is roughly classified into three types: a semiconductor such as an electronic circuit: an electronic display such as a liquid crystal device; and a general electronic component other than the semiconductor and the electronic display (for example, a capacitor, a power supply). The electronic device is widely used in electronic equipment and the like.

In a case where the electron source including the above laminate is a generally well-known field emission electron source and thermionic emission electron source, for example, the following embodiment can be illustrated.

Examples of the field emission electron source include an aspect of forming a laminate having a structure of: forming a lanthanum hexaboride layer (corresponding to the "lanthanoid boride film" of the present application) on a metal needle for field electron emission (corresponding to the "substrate" of the present application); and coating the lanthanum hexaboride layer with the monoatomic layer hexagonal boron nitride thin film. In this case, heating is performed at a temperature from 500 to 600° C., and the laminate is used as the field emission electron source in this state. When heating is performed at a temperature from 500 to 600° C., a clean surface can be held, so that attenuation of emission current due to adsorption of a residual gas or the like, which is a problem of a conventional field emission source is prevented.

Examples of the thermionic emission electron source include an aspect of forming a laminate having a structure of: forming a lanthanum hexaboride layer (corresponding to the "lanthanoid boride film" of the present application) on a substrate; and coating the layer with a monoatomic layer hexagonal boron nitride thin film. In this case, the temperature and thermionic emission current are increased by electrically heating the above lanthanum hexaboride layer or by heating the above substrate. As described above, in the conventional thermionic emission electron source using lanthanum hexaboride, it is necessary to operate at 1300° C. or higher for cleaning, but in the above thermionic emission electron source according to the present invention, since the cleaning can be performed at a temperature lower than 1300° C. the operating temperature is lowered. As a result, evaporation of the surface atoms is suppressed, and the life of the electron source is expected to be prolonged.

Another aspect of the present invention is a method for producing the above laminate.

As a method for producing the laminate of the present invention, for example, there is a method for producing the laminate of the present invention by the following: forming a lanthanoid boride film containing nitrogen on a substrate; and diffusing nitrogen in the lanthanoid boride film by heating the lanthanoid boride film in a temperature range of higher than 750° C. and lower than 1200° C. in vacuum: reacting the nitrogen with boron atoms contained in the lanthanoid boride film on a surface of the lanthanoid boride film to precipitate a monoatomic layer hexagonal boron nitride thin film on the surface of the lanthanoid boride film; and coating the surface of the lanthanoid boride film with the precipitated monoatomic layer hexagonal boron nitride thin film.

Here, the method for forming a lanthanoid boride film containing nitrogen on a substrate is not particularly limited as long as the object of the present invention can be achieved, and examples thereof include a method for forming a film by means of sputtering deposition and a method for forming a film by means of nitrogen radical irradiation.

The method for forming a film by means of sputtering deposition is a method for forming a thin film by causing plasma-converted inert gas (mainly argon) ions to collide with each other with high energy and adhering flicked fine particles of the target material to an object placed at a distant position. Specifically, it is a method in which sputtering is performed in an inert gas ambient of argon gas by the use of a lanthanoid boride sintered body containing nitrogen as a target, and the lanthanoid boride film containing the nitrogen is formed on a substrate by the sputtering deposition. In general, a film is formed by depositing a lanthanoid boride film containing nitrogen by RF sputtering deposition method. When the lanthanoid boride film is formed by the RF sputtering deposition, the lanthanoid boride film can have a high degree of freedom in shape and high extensibility, which are not provided in the single crystal material.

The inert gas is not particularly limited as long as the object of the present invention can be achieved, and examples thereof include generally chemically inert gases such as nitrogen gas and rare gas. In the present invention, when the film is formed by means of sputtering deposition described above by the use of the lanthanoid boride sintered body containing nitrogen, it is preferable not to use nitrogen gas that causes excessive impurity supply. Therefore, it is preferable to use a rare gas, and it is more preferable to use an argon gas from the viewpoint of versatility and the like. However, the film formed by means of sputtering deposition described above can be also performed by the use of a lanthanoid boride sintered body not containing nitrogen, and in this case, nitrogen may be used as an inert gas, for example, an inert gas containing nitrogen (for example, nitrogen-containing argon gas) may be used.

The method for forming a film by means of nitrogen radical irradiation is a method for irradiating a surface of a target material with nitrogen radicals in vacuum to form a lanthanoid boride film containing nitrogen on the surface. Specifically, it is a method in which a surface of a lanthanoid boride single crystal substrate or a surface of a $SiO_2$ substrate including a polycrystalline lanthanoid boride film is irradiated with nitrogen radicals at room temperature in vacuum, and a lanthanoid boride film containing nitrogen is formed on the surface of the above substrate by the irradiation to form a film.

Examples of the method for coating the lanthanoid boride film containing nitrogen formed on the substrate with a monoatomic layer hexagonal boron nitride thin film include a method for performing the following: heating the lanthanoid boride film containing nitrogen formed on the substrate by the above method at a temperature range of higher than 750° C. and lower than 1200° C. in vacuum; and reacting the nitrogen with boron atoms contained in the lanthanoid boride film on the surface of the lanthanoid boride film by thermal diffusion of the nitrogen in the lanthanoid boride film by the above heating to precipitate a monoatomic layer hexagonal boron nitride thin film on the surface of the lanthanoid boride film, thereby coating the lanthanoid boride film with the monoatomic layer hexagonal boron nitride thin film.

The vacuum pressure and the heating conditions are not particularly limited as long as the object of the present invention can be achieved, but the following ranges are preferable from the viewpoint of thermal diffusion of nitrogen.

The vacuum pressure is preferably in a range of $1\times10^{-9}$ Pa or higher and $1\times10^{-5}$ Pa or less, and more preferably $1\times10^{-9}$ Pa or higher and $5\times10^{-7}$ Pa or less.

The heating temperature is in a temperature range of higher than 750° C. and lower than 1200° C., but is preferably in a range of 800° C. or higher and 1100° C. or less. The heating time is preferably 5 minutes or more and 3 hours or less.

Examples of the method for forming the lanthanoid boride film containing nitrogen on the substrate also include a method for forming a film by performing the following: forming a lanthanoid boride film not containing nitrogen on the substrate by a method such as sputtering deposition; and then forming a lanthanoid boride film containing nitrogen by the above method for forming a film by means of nitrogen radical irradiation.

Specific examples thereof include a method for forming a lanthanoid boride film containing nitrogen on the substrate by performing the following: forming a <100> oriented polycrystalline lanthanum hexaboride ($LaB_6$) film that is not doped with nitrogen on a substrate by means of sputtering deposition; and then irradiating the polycrystalline lanthanum hexaboride film that is not doped with nitrogen with nitrogen radicals.

Also, in order to coat the lanthanoid boride film not containing nitrogen formed on the substrate with a monoatomic layer hexagonal boron nitride thin film, for example, a borazine gas ($B_3N_3H_6$) may be exposed, and the surface thereof may be coated with a monoatomic layer hexagonal boron nitride thin film by chemical vapor deposition.

As described above, the method for producing the laminate of the present invention is performed by the following: forming a lanthanoid boride film containing nitrogen on a substrate; and then coating the lanthanoid boride film with a monoatomic layer hexagonal boron nitride thin film. Therefore, hexagonal boron nitride is not present at the time when the lanthanoid boride film containing nitrogen is formed on the substrate by the above method for forming a film by means of sputtering deposition or the above method for forming a film by means of nitrogen radical irradiation. That is, the above nitrogen is not present as hexagonal boron nitride. By the subsequent heating in a temperature range of higher than 750° C. and lower than 1200° C. in vacuum, nitrogen in the above lanthanoid boride film is thermally diffused, whereby boron atoms contained in the above lanthanoid boride film are reacted on the surface of the lanthanoid boride film to form hexagonal boron nitride as a monoatomic layer. As a result, the above lanthanoid boride film is coated with a monoatomic layer hexagonal boron nitride thin film.

The surface of the hexagonal boron nitride thin film having a film thickness of a monoatomic layer is not equivalent to the surface of hexagonal boron nitride of bulk, and is treated as a physical adsorption system of an insulator film having an extremely thin film thickness. As a result, the surface electronic properties of the laminate of the present invention greatly depend on the electronic properties of the lanthanoid boride film as a base of hexagonal boron nitride, and the work function of this system (that is, the work function of the laminate of the present invention) is given by the work function of the lanthanoid boride film as the base.

Another aspect of the present invention is a method for cleaning the above laminate. Specifically, it is a method for performing the following: exposing to an ambient gas the above laminate in which a surface of a lanthanoid boride film formed on a substrate is coated with a thin film made of monoatomic layer hexagonal boron nitride; and then cleaning the above laminate contaminated with the ambient gas by vacuum heating at a low temperature of 500° C. or higher and 600° C. or less.

It is desirable to vacuum-heat the above laminate at a low temperature of 500° C. or higher and 600° C. or less. This is because, as described above, the laminate after being exposed to the ambient gas becomes to be cleaned at a heating temperature lower than that in the prior art (specifically, a temperature lower than 1300° C.).

Also, according to the cleaning method of the present invention, even if the above laminate exposed to the ambient gas is cleaned at a low temperature of 500° C. or higher and 600° C. or less, which is much lower than that in the prior art, the work function of the above laminate before and after the cleaning is approximately the same, and the low work function of the above laminate can be maintained without being increased even after the cleaning. This is desirable as an electronic material, as described above.

Conditions not specified in the present application are not particularly limited as long as the object of the present invention can be achieved.

EXAMPLES

Next, an embodiment of the present invention will be described more specifically with reference to Examples, but the embodiment of the present invention is not limited to the following Examples as long as it does not exceed the gist thereof.

The laminate of the present invention containing a lanthanoid boride film formed on a substrate wherein a surface of the lanthanoid boride film is coated with a thin film, and wherein the thin film is a monoatomic layer hexagonal boron nitride thin film was produced by the following two methods in which lanthanum hexaboride ($LaB_6$) is used as a typical example of the lanthanoid boride. The first is a method in which a film of a lanthanum hexaboride film containing nitrogen is formed on a substrate by the use of a method for forming a film by means of sputtering deposition, and the second is a method in which a film of a lanthanum hexaboride film containing nitrogen is formed on a substrate by the use of a method for forming a film by means of nitrogen radical irradiation.

Example 1

First, a film of a lanthanum hexaboride ($LaB_6$) film containing nitrogen was formed on a substrate by the use of the method for forming a film by means of sputtering deposition. This is specifically as follows.

<Formation of Film by Means of Sputtering Deposition>

A lanthanum hexaboride ($LaB_6$) film containing nitrogen was deposited on a lanthanum hexaboride single crystal substrate or a $SiO_2$ substrate on which a polycrystalline lanthanum hexaboride film was laminated by means of RF sputtering deposition method to form a film. Specifically, "Canon ANELVA E200-S" was used as an RF sputtering deposition apparatus (that is, the film forming apparatus for the lanthanum hexaboride film), and a lanthanum hexaboride ($LaB_6$) sintered body containing 0.4 wt % of nitrogen was used as a target. The pressure in the apparatus during sputtering deposition was kept in the range of 0.3 to 0.5 Pa while maintaining an argon gas ambient with an argon gas flow rate of 10 sccm. Sputtering power was set to 20 to 50 W, and substrate temperature during sputtering deposition was set to room temperature. However, the substrate temperature may be in the range of room temperature to 150° C.

The thickness of the formed lanthanum hexaboride film was measured by means of a stylus profiler apparatus ("Alpha-Step D-500" manufactured by "KLA-Tencor"), and was in the range of 20 to 60 nm.

As described above, the sputtering deposition was performed under an ambient of only argon gas, and nitrogen gas was not supplied during the sputtering deposition.

Also, annealing was not performed immediately after film formation.

Next, a monoatomic layer hexagonal boron nitride thin film was coated on the lanthanum hexaboride film containing nitrogen that was formed on the substrate by the above method for forming a film by means of sputtering deposition, thereby preparing a laminate of the present invention. This is specifically as follows.

<Coating with Monoatomic Layer Hexagonal Boron Nitride Thin Film>

The lanthanum hexaboride ($LaB_6$) film containing nitrogen formed on the substrate by the above method for forming a film by means of sputtering deposition or the above method for forming a film by means of nitrogen radical irradiation was heated in a vacuum of $1\times10^{-5}$ Pa or less in a temperature range of 800 to 1100° C., thereby precipitating and coating a monoatomic layer hexagonal boron nitride thin film on the surface of the lanthanum hexaboride film. As such, the laminate of the present invention was obtained. Here, the heating temperature was measured by the use of a pyrometer ("Impac 8 Pro Series" manufactured by "Advanced Energy Industries, Inc."). The heating was performed by means of an electron beam bombardment heating. However, this heating may be any of an electrical heating, an electron beam bombardment heating, and a radiation heating. The heating time was set to a time until the base pressure was recovered or a time until the pressure reached $2\times10^{-7}$ Pa or less in order to obtain an equilibrium state on the surface of the laminate at each set temperature. Specifically, it was in the range of 30 minutes to 3 hours.

The above vacuum heating for coating the surface of the above lanthanum hexaboride film with a monoatomic layer hexagonal boron nitride thin film does not need to be performed in the apparatus to form the film immediately after the above lanthanum hexaboride film is formed, and may be performed after the lanthanum hexaboride film containing nitrogen formed on the substrate is once exposed to air.

Regarding the laminate obtained as described above, it was confirmed by the following method that a monoatomic layer hexagonal boron nitride thin film was formed on the surface thereof.

<Confirmation of Coating by Means of Auger Electron Spectroscopy (AES) Measurement>

Regarding vacuum heating for coating the lanthanum hexaboride ($LaB_6$) film containing nitrogen formed on the substrate with a monoatomic layer hexagonal boron nitride thin film, in order to evaluate a change in surface composition of the lanthanum hexaboride film due to a change in heating temperature, a combination of a cylindrical mirror electron analyzer (manufactured by "YAMAMOTO SHINKU KENKYUSHO") and an electron gun ("RDA001 type" manufactured by "R-DEC Co., Ltd.") was used as an Auger electron spectroscopy (AES) measurement device. The vacuum pressure in the device was set from $2\times10^{-8}$ to $1\times10^{-7}$ Pa. The measurement was performed on the above lanthanum hexaboride film immediately after being formed and before vacuum heating and the above lanthanum hexaboride film vacuum-heated at each temperature in the range of 500 to 1200° C. Regarding the above vacuum-heated lanthanum hexaboride ($LaB_6$) film, the measurement thereof was performed at room temperature after completion of vacuum heating. The energy of the electron beam was set to 15 keV, and the irradiation angle was set to about 70° from the direction perpendicular to the surface. The results are shown in FIG. 2.

From the results in FIG. 2, it was confirmed that a signal corresponding to nitrogen appearing around 390 eV, which was not observed up to 750° C., is detected at 800° C. exceeding 750° C. At the same time, it was also confirmed that the signal corresponding to nitrogen was detected even at 1100° C. and was not detected at 1200° C.

Therefore, it was found that it is necessary to perform vacuum heating in a temperature range of higher than 750° C. and lower than 1200° C. in order for the nitrogen-containing film to appear on the lanthanum hexaboride film containing nitrogen formed on the substrate.

<Confirmation by Means of High-Resolution Electron Energy Loss Spectroscopy (HREELS) Measurement>

In order to identify the structure of surface composition of the above lanthanum hexaboride ($LaB_6$) film vacuum-heated at each temperature in the range of 750° C. to 1200° C. on the basis of the above Auger electron spectroscopy (AES) measurement result, high-resolution electron energy loss spectroscopy (HREELS) measurement was performed. This method is a method for evaluating a bonding state of atoms from surface atomic vibration to determine a surface atomic structure. The device used for the high-resolution electron energy loss spectroscopy (HREELS) measurements is a "Delta-0.5" manufactured by "Specs GmbH". The incident energy of electrons was set to 2.0 eV, and measurement was performed under specular reflection conditions. The measurement was performed at room temperature after completion of vacuum heating. The results are shown in FIG. 3.

Figure 3:
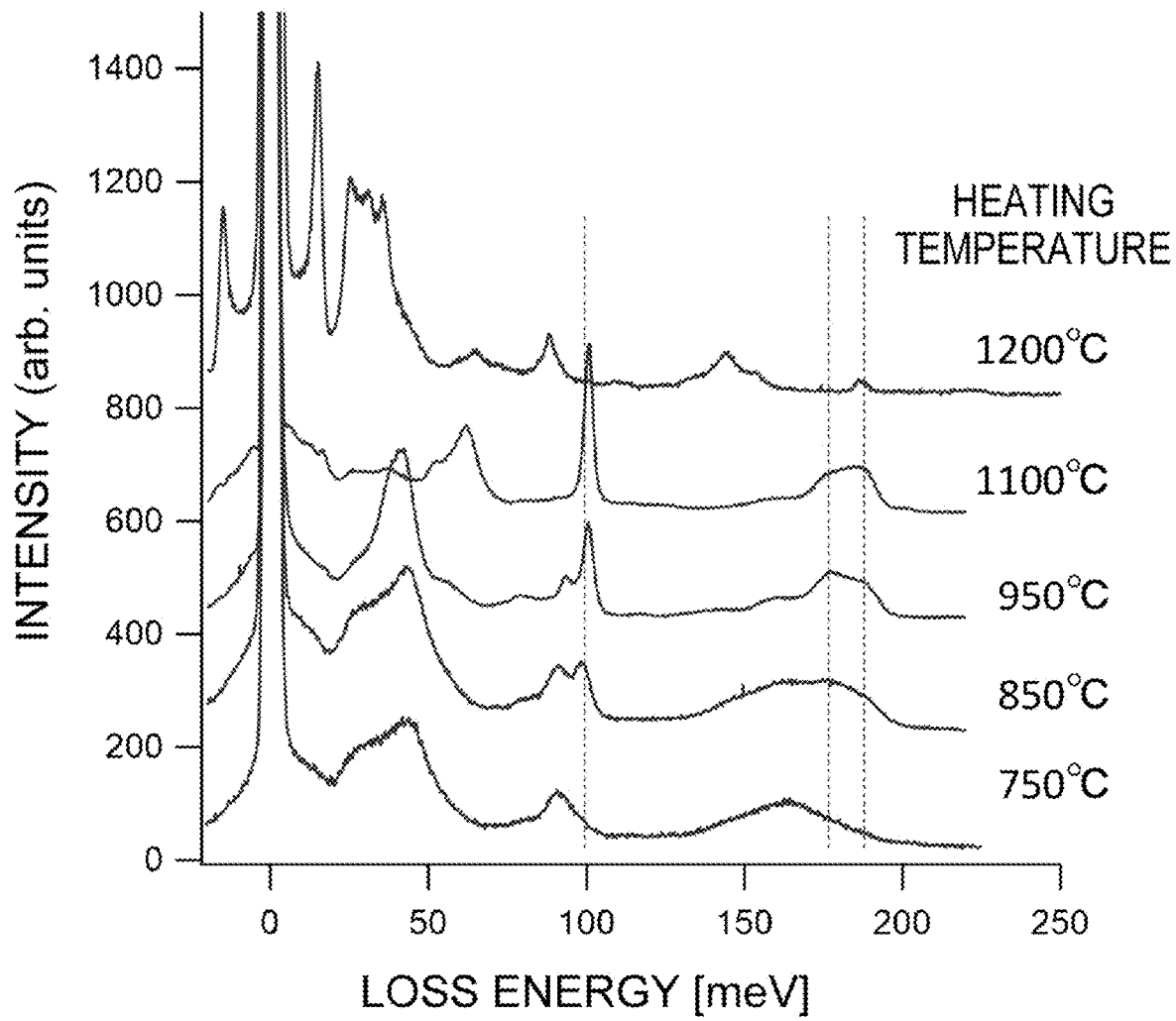
FIG. 3 is high-resolution electron energy loss spectroscopy (HREELS) measurement results, and is a diagram showing results related to changes in surface composition depending on heating temperatures of a lanthanum hexaboride ($LaB_6$) film containing nitrogen formed on a substrate by means of sputtering deposition.

As shown in the results of FIG. 3, when vacuum heating was performed at 850° C. to 1100° C., loss energy peaks of 100, 173, and 180 meV were detected. These peaks were confirmed to almost coincide with phonon energies of a monoatomic layer hexagonal boron nitride thin film reported in "E. Rokuta et al., "Phonon Dispersion of an Epitaxial Monolayer Film of Hexagonal Boron Nitride on Ni(111)", Phys. Rev. Lett. 79, 4609 [1997]" (that is, vibration peaks of a monoatomic layer hexagonal boron nitride thin film). That is, when vacuum heating was performed at 850° C. to 1100° C., it was confirmed that a monoatomic layer hexagonal boron nitride thin film is formed on the surface of the above lanthanum hexaboride film. On the other hand, no loss energy peaks at 100, 173, and 180 meV were detected at 750° C. and 1200° C.

Therefore, it was found that by performing vacuum heating in a temperature range of higher than 750° C. and lower than 1200° C., the lanthanum hexaboride film containing nitrogen formed on the substrate can be coated with a monoatomic layer hexagonal boron nitride thin film.

<Confirmation of Coating by Means of X-Ray Absorption Near Edge Structure (XANES) Measurement>

In order to identify the structure of surface composition of the above lanthanum hexaboride ($LaB_6$) film vacuum-heated in a temperature range of higher than 750° C. and lower than 1200° C., as a typical example thereof, the structure of surface composition vacuum-heated at 800° C. was also identified by another method. Specifically. X-ray absorption near edge structure (XANES) measurement was performed by means of a beamline (BL7U vacuum ultraviolet spectroscopy) instrument at "Aichi Synchrotron Radiation Center". This measurement method is a method for observing an electronic state unique to a substance and identifying the substance. At that time, in order to demonstrate that a monoatomic layer hexagonal boron nitride was formed on the surface, a hexagonal boron nitride powder was used as a reference sample. The results are shown in FIG. 4.

Figure 4:
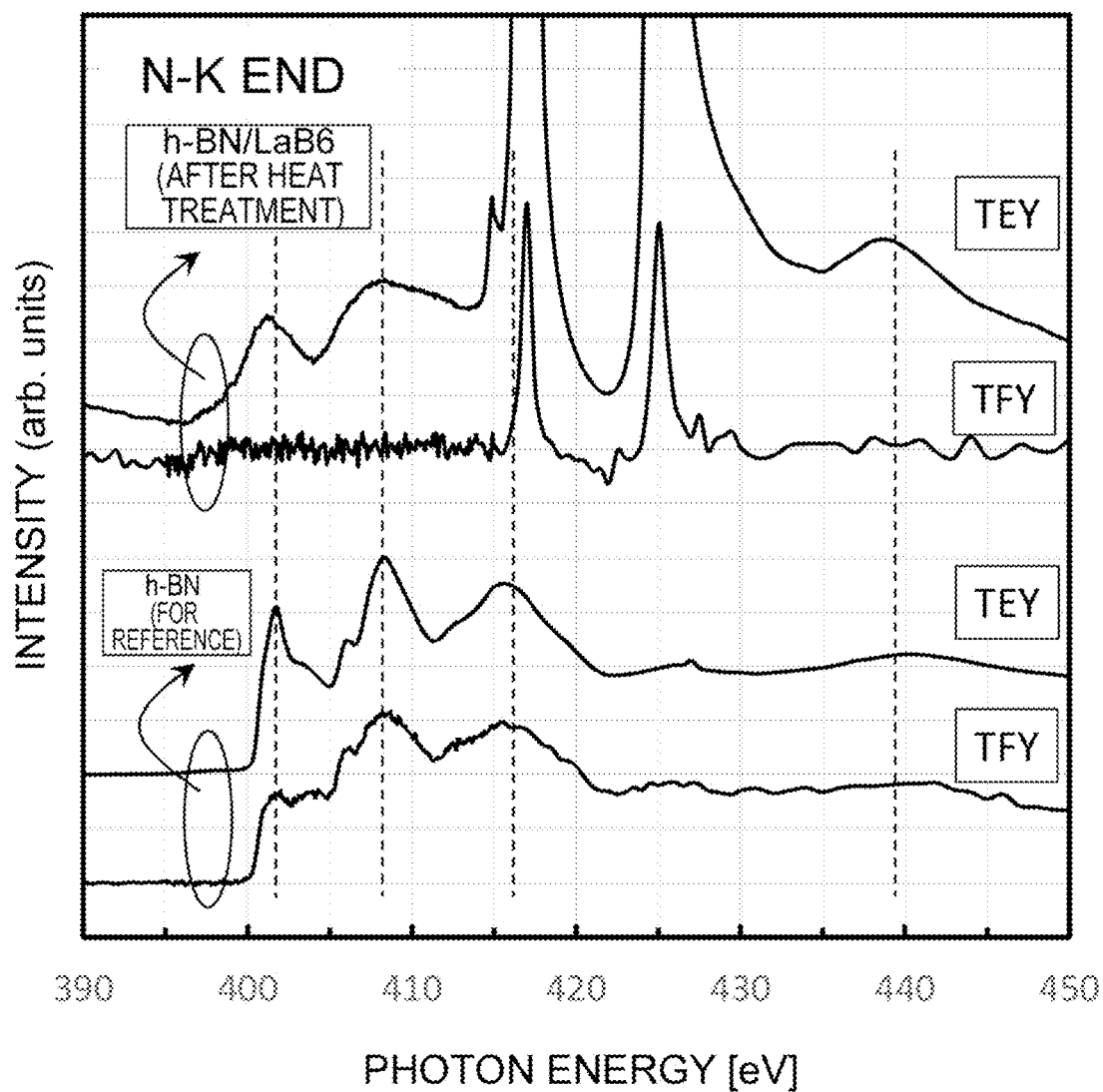
FIG. 4 is X-ray absorption near edge structure (XANES) measurement results, and is a diagram showing results related to a surface structure of a laminate obtained by subjecting a lanthanum hexaboride ($LaB_6$) film containing nitrogen formed on a substrate by means of sputtering deposition to vacuum heating at 660° C. (in the figure, TEY represents a spectrum obtained by the total electron yield method, and TFY represents a spectrum obtained by the total fluorescence yield method.).

The spectra in FIG. 4 are XANES spectra near the nitrogen K-edge. In this measurement, the total electron yield (TEY) methodsensitive to surface detection and the total fluorescence yield (TFY) methodsensitive to a bulk detection were used in combination. The measured sample was a laminate obtained by being subjected to vacuum heating at 800° C. as described above, and after the vacuum heating, the laminate was exposed to air, transferred to the beamline instrument, and then re-cleaned at a temperature of 660° C. in the beamline instrument. As can be seen from dashed lines in FIG. 4, in a spectrum by TEY of the laminate obtained by being subjected to the above vacuum heating (specifically, "h-BN/LaB$_6$ (after heating)" in FIG. 4), peaks indicating the same structure at the same energy position as a spectrum by TEY and a spectrum by TFY of hexagonal boron nitride for reference (specifically, "h-BN (for reference)" in FIG. 4) were confirmed. On the other hand, it was confirmed that a peak indicating such a structure was not detected in a spectrum by TFY simultaneously measured for the laminate obtained by being subjected to the above vacuum heating. From these results, it was found that in the laminate obtained by being subjected to the above vacuum heating, hexagonal boron nitride does not exist inside, and exists only on the surface. The hexagonal boron nitride existing on the surface was also found to be a monoatomic layer taking into account of the detection sensitivity of TFY.

Therefore, it was found that by performing vacuum heating in a temperature range of higher than 750° C. and lower than 1200° C., the lanthanum hexaboride film containing nitrogen formed on the substrate can be coated with a monoatomic layer hexagonal boron nitride thin film.

Example 2

First, a film of a lanthanum hexaboride (LaB$_6$) film containing nitrogen was formed on a substrate by the use of the method for forming a film by means of nitrogen radical irradiation. This is specifically as follows.
<Formation of Film by Means of Nitrogen Radical Irradiation>

A lanthanum hexaboride (LaB$_6$) film containing nitrogen was formed on a lanthanum hexaboride (001) single crystal substrate by irradiating the substrate with nitrogen radicals at room temperature for 3 minutes. Specifically, a radical source apparatus ("ER-1000" manufactured by "EIKO Corporation") was used, and the pressure in the apparatus was kept in the range of $1 \times 10^{-2}$ to $2 \times 10^{-2}$ Pa under a nitrogen ambient at a nitrogen gas flow rate of 4 sccm. The power was set to 280 W.

Next, a monoatomic layer hexagonal boron nitride thin film was coated on the lanthanum hexaboride (LaB$_6$) film containing nitrogen formed on the substrate by the above method for forming a film by means of nitrogen radical irradiation, thereby preparing the laminate of the present invention.
<Coating with Monoatomic Layer Hexagonal Boron Nitride Thin Film>

A monoatomic layer hexagonal boron nitride thin film was precipitated and coated on the surface of the above lanthanum hexaboride film by the same method as in Example 1 with the lanthanum hexaboride (LaB$_6$) film containing nitrogen formed on the substrate by the above method for forming a film by means of sputtering deposition or the above method for forming a film by means of nitrogen radical irradiation, thereby obtaining the laminate of the present invention.

Regarding the laminate obtained as described above, it was confirmed by the following method that a monoatomic layer hexagonal boron nitride thin film was formed on the surface thereof.
<Confirmation of Coating by Means of Auger Electron Spectroscopy (AES) Measurement>

Regarding vacuum heating for coating the lanthanum hexaboride (LaB$_6$) film containing nitrogen formed on the substrate with a monoatomic layer hexagonal boron nitride thin film, in order to evaluate a change in surface composition of the lanthanum hexaboride film due to a change in heating temperature, Auger electron spectroscopy (AES) measurement was performed at room temperature in the same manner as in Example 1. Therefore, the measurement conditions are the same as those in Example 1.

Figure 5:
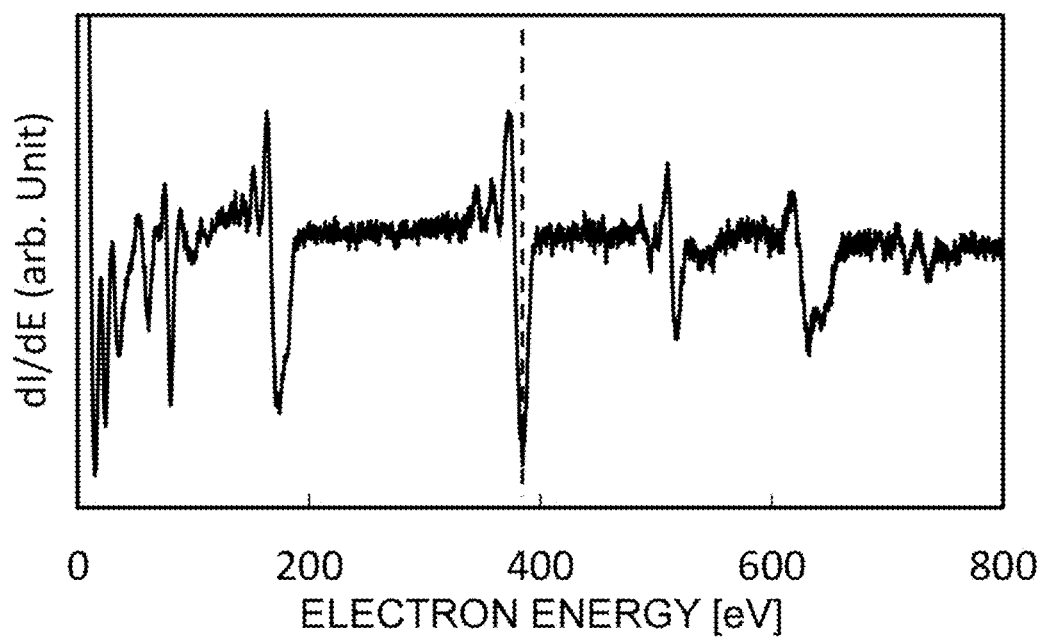
FIG. 5 is Auger electron spectroscopy (AES) measurement result, and is a diagram showing a result related to a change in surface composition by vacuum heating at 800° C. of a lanthanum hexaboride ($LaB_6$) film containing nitrogen formed on a substrate by means of nitrogen radical irradiation.

One of the results (a case where the vacuum heating condition is heating at 800° C. for 15 minutes in a vacuum of $1 \times 10^{-6}$ Pa) is shown in FIG. 5.

As shown in the results of FIG. 5, similarly to Example 1, it was confirmed that a signal corresponding to nitrogen appearing around 390 eV, which was not observed up to 750° C., is detected at 800° C. exceeding 750° C. Although not shown, it was also confirmed that the signal corresponding to nitrogen was detected even at 1100° C., and was not detected at 1200° C.

Therefore, as in Example 1, it was found that it is necessary to perform vacuum heating in a temperature range of higher than 750° C. and lower than 1200° C. in order for the nitrogen-containing film to appear on the lanthanum hexaboride film containing nitrogen formed on the substrate.
<Confirmation of Coating by Means of High-Resolution Electron Energy Loss Spectroscopy (HREELS) Measurement>

In order to identify the structure of surface composition of the above lanthanum hexaboride (LaB$_6$) film vacuum-heated at each temperature in the range of 750° C. to 1200° C. on the basis of the above Auger electron spectroscopy (AES) measurement result, high-resolution electron energy loss spectroscopy (HREELS) measurement was performed in the same manner as in Example 1. Therefore, the measurement conditions are the same as those in Example 1.

Figure 6:
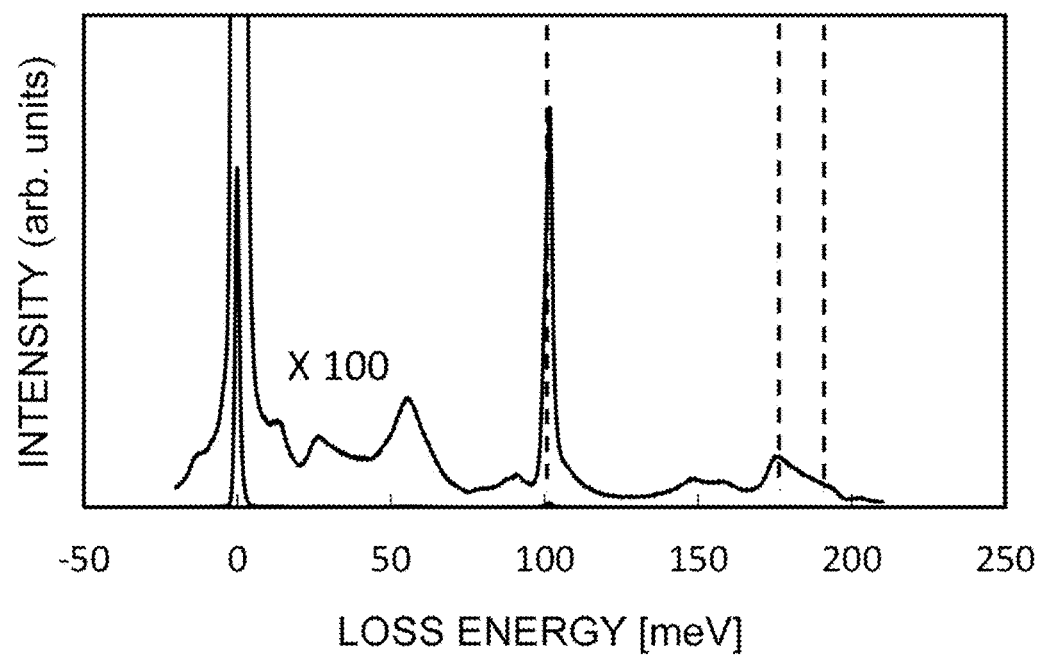
FIG. 6 is high-resolution electron energy loss spectroscopy (HREELS) measurement result, and is a diagram showing a result related to a change in surface composition by vacuum heating at 800° C. of a lanthanum hexaboride ($LaB_6$) film containing nitrogen formed on a substrate by means of nitrogen radical irradiation.

One of the results (when the vacuum heating condition is heating at 800° C. for 15 minutes in a vacuum of $1 \times 10^{-6}$ Pa) is shown in FIG. 6.

As shown in the results of FIG. 6, when vacuum heating was performed at 800° C., loss energy peaks of 100, 173, and 180 meV were detected as in Example 1. These peaks were confirmed to almost coincide with phonon energies of a monoatomic layer hexagonal boron nitride thin film reported in "E. Rokuta et al., "Phonon Dispersion of an Epitaxial Monolayer Film of Hexagonal Boron Nitride on Ni(111)", Phys. Rev. Lett. 79, 4609 [1997]" (that is, vibration peaks of a monoatomic layer hexagonal boron nitride thin film). Although not shown, it was also confirmed that the temperature of vacuum heating was detected even at 1100° C., and was not detected at 1200° C. That is, when vacuum heating was performed at 850° C. to 1100° C., it was confirmed that a monoatomic layer hexagonal boron nitride thin film is formed on the surface of the above lanthanum hexaboride film.

Therefore, it was found that by performing vacuum heating in a temperature range of higher than 750° C. and lower than 1200° C., the lanthanum hexaboride film containing nitrogen formed on the substrate can be coated with a monoatomic layer hexagonal boron nitride thin film.

Example 3

Figure 7:
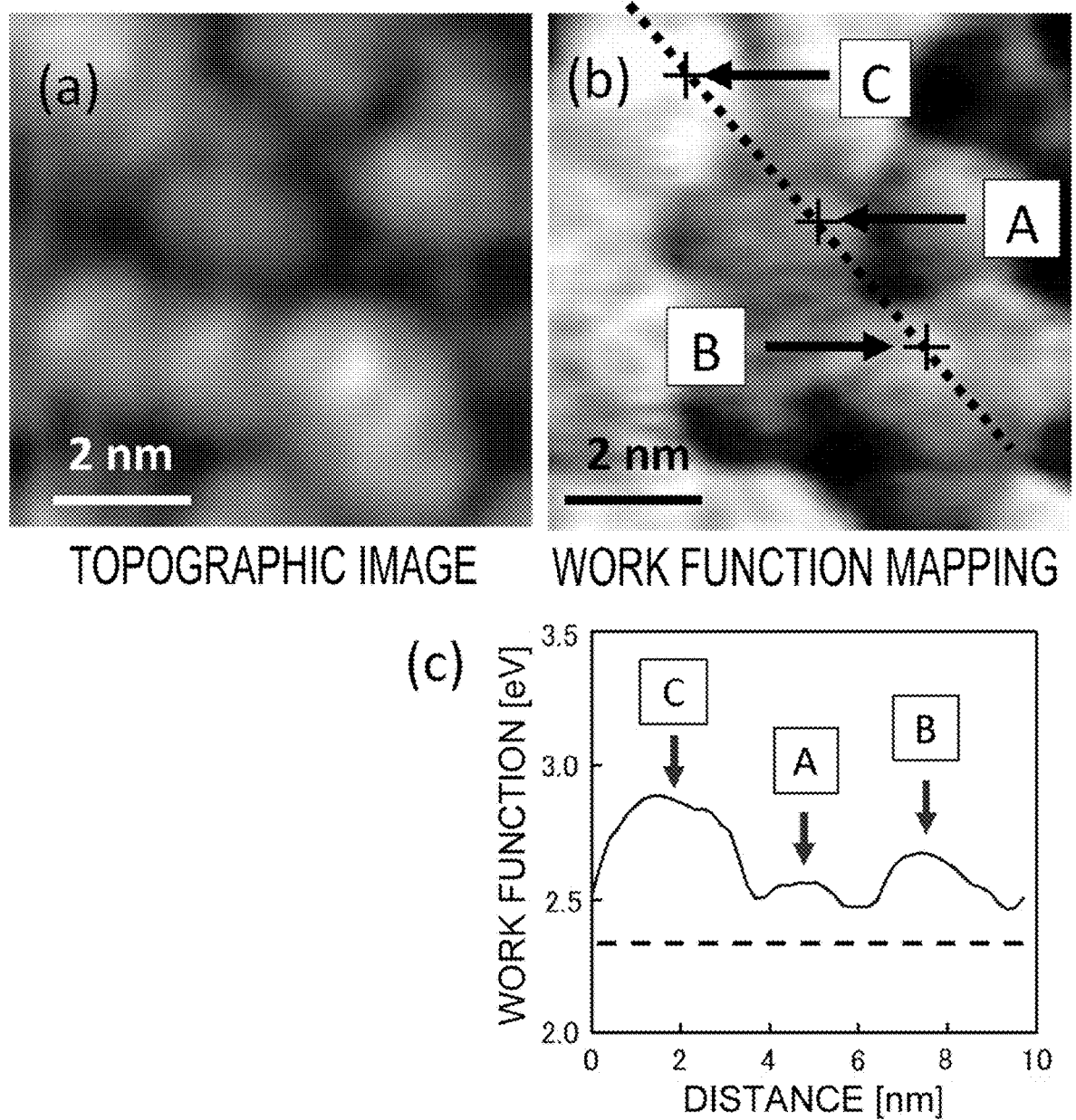
FIG. 7 is scanning tunneling microscope (STM) measurement results, and is a diagram showing a result related to a surface of a laminate obtained by subjecting a lanthanum hexaboride ($LaB_6$) film containing nitrogen formed on a substrate by means of sputtering deposition to vacuum heating at 800° C., exposing the laminate to air, and then cleaning the laminate by vacuum heating at a temperature of 450° C. (in the figure, (a) shows a topographic image representing geometric irregularities, (b) shows work function mapping of the same region simultaneously measured with (a), and (c) shows a work function profile along a dotted line in (b).).
Figure 8:
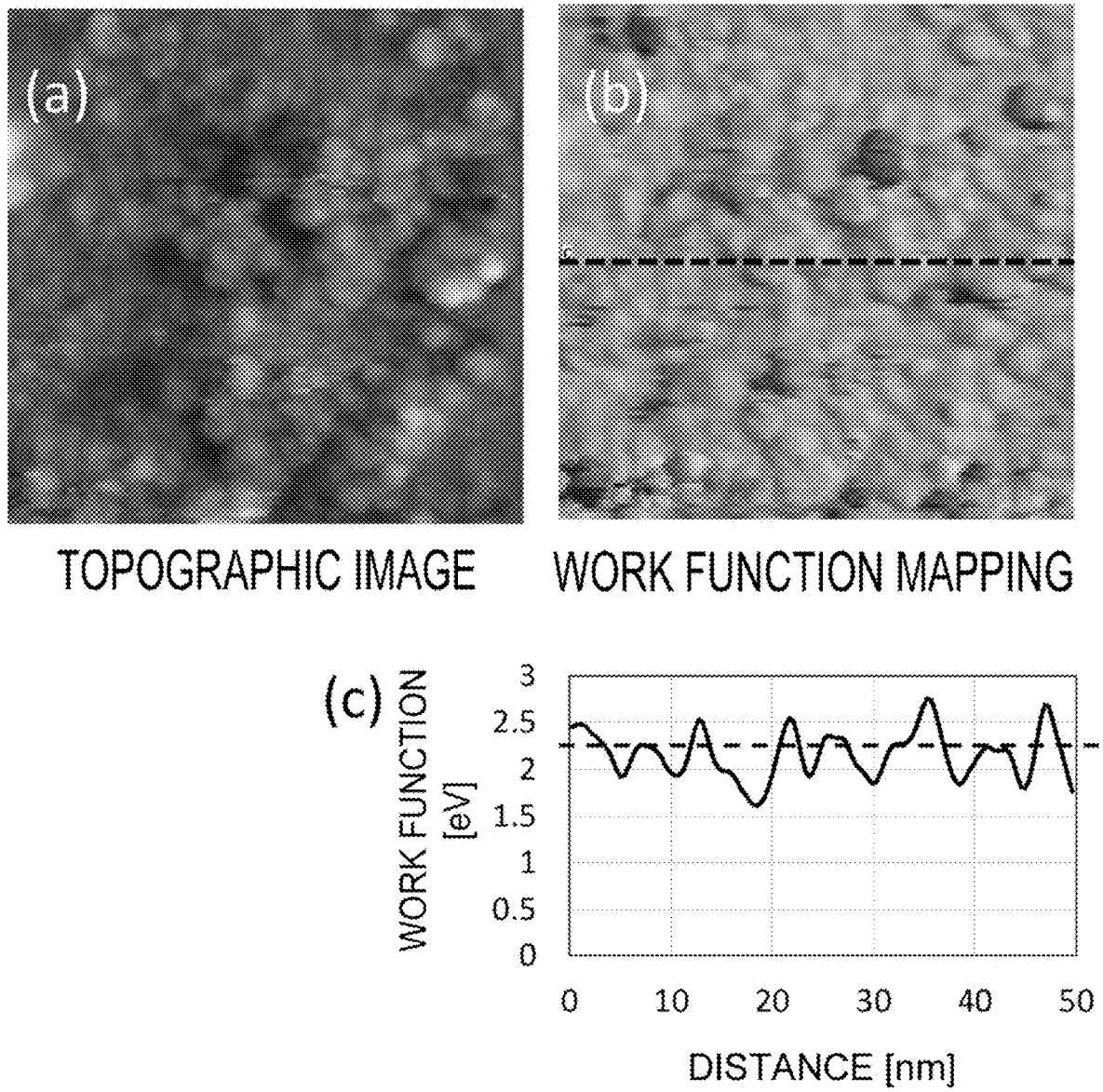
FIG. 8 is scanning tunneling microscope (STM) measurement results, and is a diagram showing a result related to a surface of a laminate obtained by subjecting a lanthanum hexaboride ($LaB_6$) film containing nitrogen formed on a substrate by means of sputtering deposition to vacuum heating at 800° C., exposing the laminate to air, and then cleaning the laminate by vacuum heating at a temperature of 550° C. (in the figure, (a) shows a topographic image representing geometric irregularities, (b) shows work function mapping of the same region simultaneously measured with (a), and (c) shows a work function profile along a dotted line in (b).).

<Cleaning Evaluation>
The laminates finally obtained in Examples 1 and 2 were exposed to air, and then vacuum heating was performed. As a typical example, among the laminates finally obtained in Example 1, regarding the case where the temperature of vacuum heating for precipitating and coating a monoatomic layer hexagonal boron nitride thin film on the surface of the above lanthanum hexaboride (LaB$_6$) film is 800° C., the results of cleaning the laminate at heating temperatures of 450° C. and 550° C. in a vacuum of $3 \times 10^{-7}$ Pa after being exposed to air are shown in FIGS. 7 and 8, respectively. Here, the heating of the laminate was performed by means of an electrical heating, and the temperature was measured with a pyrometer. Also, the heating time was set to, at the above set temperature (450° C.), a time until the base pressure ($2\times10^{-8}$ Pa) was recovered or a time until the pressure reached less than $1\times10^{-7}$ Pa, specifically, about 30 minutes to 2 hours. Also, the surface state of the laminate after vacuum heating was evaluated by means of a scanning tunneling microscope (STM) measurement. In the measurement, "LT-STM" manufactured by "Omicron, Inc." was used as a scanning tunneling microscope (STM) apparatus. By the use of this apparatus, topographic images and local work function mapping were measured simultaneously. The tunnel condition was measured with a sample bias of −3.5 V, a tunnel current of 0.5 nA, a probe amplitude of 1 A, and 1 kHz. FIGS. 7(a) and 8(a) are topographic images representing geometric irregularities. FIGS. 7(b) and 8(b) are work function mappings of the same region measured simultaneously, and FIGS. 7(c) and 8(c) are a work function profile along a dotted line in FIG. 7(b) and a work function profile along a dotted line in FIG. 8(b), respectively.

From the results in FIG. 7, it was confirmed that uniform work function distribution cannot be obtained by vacuum heating at 450° C., and the work function value is also increased by about 0.2 to 0.6 eV as compared with the original low work function of the lanthanum hexaboride film (that is, 2.3 eV, which is a dashed line in FIG. 7(c)). That is, it was found that vacuum heating at 450° C. is insufficient for cleaning of the laminate after air exposure.

On the other hand, from the results of FIG. 8, it was confirmed that uniform work function distribution is obtained by vacuum heating at 550° C. exceeding 450° C., and the original low work function of the lanthanum hexaboride film (that is, 2.3 eV, which is a dashed line in FIG. 8(c)) is sufficiently recovered as the work function value. That is, it was found that vacuum heating at 550° C. or 600° C. exceeding 550° C. can sufficiently clean the laminate after air exposure, and the same effect can be expected even at 500° C. significantly exceeding 450° C.

INDUSTRIAL APPLICABILITY

According to the present invention, it can be expected to be used as an electronic material such as an electron source or an electronic device using a lanthanoid boride of a low work function material that easily emits electrons and has high chemical reactivity. In particular, according to the present invention, since a clean surface can be maintained when heated to 500 to 600° C., applicability in the fields of a field emission electron source and a thermionic emission electron source and the field of using the same (for example, applicability in the field of electron microscopy) can be greatly expected.

The invention claimed is:

1. A laminate comprising a lanthanoid boride film formed on a substrate, wherein a surface of the lanthanoid boride film is coated with a thin film, and wherein the thin film is a monoatomic layer hexagonal boron nitride thin film.

2. The laminate according to claim 1, wherein the lanthanoid boride film is a lanthanum hexaboride film.

3. The laminate according to claim 1, wherein the lanthanoid boride film has a thickness of 1 nm or more and 100 nm or less.

4. The laminate according to claim 1, wherein a work function of the laminate after being exposed to an ambient gas and then performing vacuum heating at 500° C. or higher and 600° C. or less is approximately the same as a work function of the laminate before being exposed to the ambient gas.

5. An electron source comprising the laminate according to claim 1.

6. An electronic device comprising the laminate according to claim 1.

7. A method for producing the laminate according to claim 1, the method comprising:
   forming a lanthanoid boride film containing nitrogen on a substrate; and
   diffusing the nitrogen in the lanthanoid boride film by heating the lanthanoid boride film in a temperature range of higher than 750° C. and lower than 1200° C. in vacuum, reacting the nitrogen with boron atoms contained in the lanthanoid boride film on a surface of the lanthanoid boride film to precipitate a monoatomic layer hexagonal boron nitride thin film on the surface of the lanthanoid boride film, and coating the surface of the lanthanoid boride film with the precipitated monoatomic layer hexagonal boron nitride thin film.

8. The method according to claim 7, wherein the lanthanoid boride film containing the nitrogen is formed by: using a lanthanoid boride sintered body containing nitrogen as a target; and sputtering the target in an inert gas ambient.

9. The method according to claim 7, wherein the substrate is a lanthanoid boride single crystal substrate or a $SiO_2$ substrate including a polycrystalline lanthanoid boride film, and
   the lanthanoid boride film is formed by irradiating the surface of the substrate with nitrogen radicals.

10. The method according to claim 7, wherein coating the surface of the lanthanoid boride film with the precipitated monoatomic layer hexagonal boron nitride thin film is performed by heating in vacuum in the range of $1\times10^{-9}$ Pa or higher and $1\times10^{-5}$ Pa or less for 5 minutes or more and 3 hours or less to diffuse the nitrogen.

11. A method for cleaning a laminate, comprising:
   exposing the laminate in which a surface of a lanthanoid boride film formed on a substrate is coated with a thin film made of monoatomic layer hexagonal boron nitride to an ambient gas, and then subjecting the laminate contaminated with the ambient gas to vacuum heating at a low temperature of 500° C. or higher and 600° C. or less to clean the laminate.

12. The method for cleaning the laminate according to claim 11, wherein the lanthanoid boride film is a lanthanum hexaboride film.

* * * * *